United States Patent [19]

Bertotti et al.

[11] Patent Number: 4,829,344
[45] Date of Patent: May 9, 1989

[54] ELECTRONIC SEMICONDUCTOR DEVICE FOR PROTECTING INTEGRATED CIRCUITS AGAINST ELECTROSTATIC DISCHARGES

[75] Inventors: Franco Bertotti, Milan; Paolo Ferrari, Gallarate, both of Italy

[73] Assignee: SGS Microelettronica SPA, Catania, Italy

[21] Appl. No.: 921,071

[22] Filed: Oct. 20, 1986

[30] Foreign Application Priority Data

Oct. 29, 1985 [IT] Italy ................. 22639 A/85

[51] Int. Cl.⁴ .................................. H01L 29/90
[52] U.S. Cl. ............................ 357/13; 357/58; 357/33; 357/23.13
[58] Field of Search ................... 357/13, 58, 33, 13 U, 357/13 Z, 13 R, 23.13

[56] References Cited

U.S. PATENT DOCUMENTS

| | | | |
|---|---|---|---|
| 2,875,505 | 3/1959 | Pfann | 357/33 X |
| 3,192,083 | 6/1965 | Jirtl | 357/33 X |
| 3,263,092 | 7/1966 | Knauss | 357/13 X |
| 3,268,739 | 8/1966 | Dickson, Jr. | 357/13 X |
| 3,287,182 | 11/1966 | Köhl | 357/13 X |
| 3,806,773 | 4/1974 | Watanabe | 357/23.13 |
| 4,264,941 | 4/1981 | London | 357/13 X |
| 4,356,502 | 10/1982 | Yamada | 357/13 |
| 4,476,476 | 10/1984 | Yu et al. | 357/13 X |
| 4,607,274 | 8/1986 | Yoshitake | 357/13 X |
| 4,626,882 | 12/1986 | Cottrell et al. | 357/13 X |

FOREIGN PATENT DOCUMENTS

| | | | |
|---|---|---|---|
| 1046783 | 12/1958 | Fed. Rep. of Germany | 357/58 |
| 21133646 | 1/1972 | Fed. Rep. of Germany | 357/13 Z |
| 58-161378 | 9/1983 | Japan | 357/13 Z |

Primary Examiner—Andrew J. James
Assistant Examiner—William A. Mintel
Attorney, Agent, or Firm—Guido Modiano; Albert Josif

[57] ABSTRACT

This electronic semiconductor device for protecting integrated circuits against electrostatic discharges has a minimal bulk, can withstand high damaging voltages and be produced during the same production phases as the integrated circuit to be protected. The device comprises a pair of diodes connected back to back, arranged between an input of the integrated circuit to be protected and the ground line, with the cathodes connected together and formed by a single semiconductor layer and the anodes formed in a single process phase by employing top-bottom production techniques.

3 Claims, 1 Drawing Sheet

4,829,344 ent invention is to provide an electronic semiconductor device for protecting integrated circuits against electrostatic discharges which eliminates the disadvantages of the prior art, and operates reliably against positive and negative electrostatic discharges which can occur at the pins of the integrated circuit.

ELECTRONIC SEMICONDUCTOR DEVICE FOR PROTECTING INTEGRATED CIRCUITS AGAINST ELECTROSTATIC DISCHARGES

BACKGROUND OF THE INVENTION

The present invention relates to an electronic semiconductor device for protecting integrated circuits from electrostatic charges, as well as to a process for producing the device.

Protection devices for integrated circuits, particularly for linear integrated circuits, against electrostatic discharges of both signs are known in different embodiments. Some solutions, as an example, employ the base-emitter or base-collector junctions defining diodes and resistors according to different configurations. Other solutions comprise SCRs to be connected between the input terminal of the integrated circuit to be protected and a reference-voltage line.

These solutions, however, are not completely satisfactory from several points of view. In particular, these known embodiments require a relatively large integration area which contributes to increasing the overall dimensions of whole including the integrated circuit and the protection device.

Another disadvantage of the known solutions, particularly of those employing diodes and resistors, consists in that they have a relatively high series impedance, and therefore dissipated power is quite high. Therefore, these structures are effective against damaging voltages below a certain value, and cannot be employed in those applications where the integrated circuit is to be protected against very-high-voltage electrostatic discharges.

SUMMARY OF THE INVENTION

Taking into account this situation, the aim of the present invention is to provide an electronic semiconductor device for protecting integrated circuits against electrostatic discharges which eliminates the disadvantages of the prior art, and operates reliably against positive and negative electrostatic discharges which can occur at the pins of the integrated circuit.

Within this aim, a particular object of the present invention is to provide an electronic protection device having a minimal bulk, and which in particular does not require additional semiconductor area with respect to the area required for integrating the electronic circuit to be protected.

Still another object of the present invention is to provide an electronic protection device capable of withstanding high damaging voltages, so that it can be also employed in those situations wherein protection is required against high-value discharges.

Not least object of the present invention is to provide an electronic protection device which may be produced during the same process phases as the integrated circuit to be protected, thus not entailing any additional productive costs.

The aim and the objects described, as well as others which will better appear hereinafter, are achieved by an electronic semiconductor device for protecting integrated circuits against electrostatic discharges, according to the invention, arranged between an input of the integrated circuit to be protected and a reference-voltage line, comprising a pair of diodes connected back to back, each having an anode and a cathode terminal, characterized in that said diodes are closely integrated, the terminals of the two diodes connected to each other are provided in a single layer and the layers which form the terminals of the diodes connected with the input of the integrated circuit and the reference-voltage line are manufactured simultaneously.

The invention furthermore relates to a process for producing the described electronic protection device, having the above indicated features.

BRIEF DESCRIPTION OF THE DRAWINGS

Further characteristics and advantages of the invention will be better apparent from the description of a preferred, but not exclusive, embodiment, illustrated by way of non-limitative example in the accompanying drawings, where.

DESCRIPTION OF A PREFERRED EMBODIMENT

Figure 1:
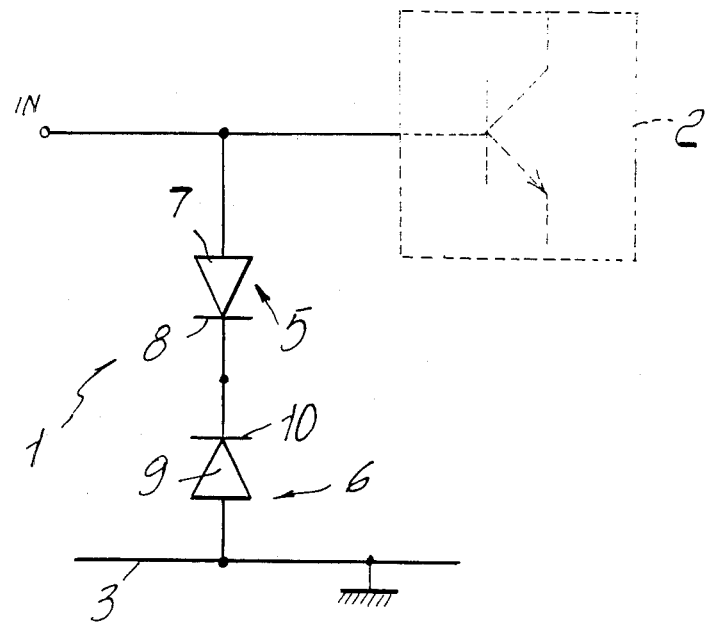
FIG. 1 is an equivalent electric diagram of the device according to the invention.

With reference to FIG. 1, the protection device according to the invention has been designated as a whole with the reference numeral 1 and is connected between the input line (IN) of an integrated circuit 2 to be protected (represented schematically as a broken-line rectangle containing linear components such as transistors) and a reference-voltage line 3 (connected to the ground). In detail, the protection device comprises a pair of diodes 5 and 6 connected in series opposing, and precisely anode 7 of the diode 5 is connected to the input line IN, while its cathode 8 is connected to cathode 10 of the diode 6, while anode 9 of the diode 6 is connected with the ground line 3.

According to the invention, the diodes 5 and 6 are closely integrated with the respective cathodes 8 and 10 formed by the same semiconductor layer, while the anodes 7 and 9 are fabricated according to the top-bottom technique. This structure is pointed out in FIG. 2, showing the reciprocal arrangement of the semiconductor layers forming the device.

Figure 2:
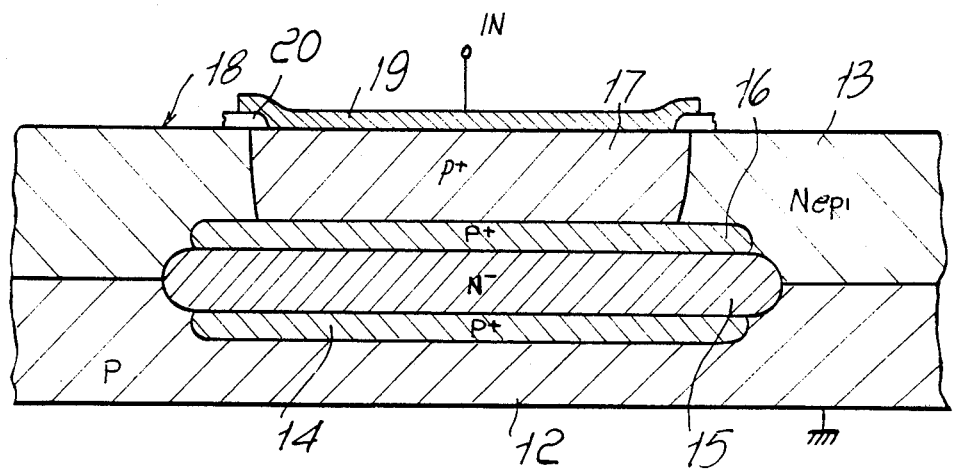
FIG. 2 is a transverse cross section through a silicon wafer in which the device of FIG. 1 has been integrated.

Thus, with reference to FIG. 2, the device comprises a P-type substrate 12 electrically connected to ground and an upper N-type epitaxial layer 13, defining a device upper face 18.

Astride the junction substrate 12/epitaxial layer 13, the diodes (5,6) according to the invention are formed. In detail, the figure illustrates P+-type region 14 extending within the substrate 12, parallel thereto, a N−-type layer 15 arranged exactly astride the substrate 12 and the epitaxial layer 13, as well as a further P+-type region 16 arranged substantially symmetrically to the region 14 with respect to the layer 15 and extending within the epitaxial layer 13. The layers 14, 15 and 16 respectively form the anode of the diode 6, the common cathode of the diodes 5 and 6 as well as the anode 7 of the diode 5. The structure is completed by a P+-type connection area 17 extending from the upper face 18 of the device up to the region 16, a metal layer 19 forming the input pad of the integrated circuit 2 and an insulating oxide layer 20, only partially shown in FIG. 2.

The process for fabricating the device according to the invention is as follows. Starting from the P-type substrate 12 (i.e. doped with boron), first a deposition and diffusion of antimony is performed. This phase is performed at the same time as the deposition and diffusion phase for the integrated circuit to be protected to provide the buried layer. In this manner an N+-type region is obtained. Subsequently, above this buried layer region an implant of boron is performed at the same time as a boron implant in the integrated circuit to be protected to obtain the implanted insulation. Subsequently the epitaxial layer 13 is grown at high temperature, with a consequent diffusion of the boron and of the antimony within the epitaxial layer and the substrate. Since however boron has a higher diffusion coefficient than antimony, a deeper diffusion of boron is obtained which traverses the antimony region and enriches the substrate area underlying the antimony-doped layer. In this manner, the region 16 forms within the epitaxial layer 13 and the region 14 forms within the substrate 12 by means of a same process phase. Then a boron deposition is performed on the epitaxial layer 13 in correspondence of regions 16 and 14 followed by the diffusion of the boron through the epitaxial layer 13 to obtain the region 17, having the purpose of bringing to the surface the anode 7 of the diode 5, corresponding to the area 16. This phase, too, can be performed simultaneously with the forming of the diffused insulation sinker in the integrated circuit to be protected.

As can be seen from the above description, the invention fully achieves the aims proposed. In particular, the fact is stressed that the device according to the invention has a very reduced bulk and actually needs no additional area apart from that already required by the integrated circuit to be protected. In fact, by virtue of the technique employed, the two diodes can be provided directly below the input pads of the integrated circuit to be protected.

Furthermore, the device according to the invention is capable of withstanding high damaging voltages. In fact, with respect to the solutions employing diodes provided by making use of the base-emitter or base-collector connection of transistor structures, it has a much lower series impedance and consequently matchingly reduced dissipated power.

Finally, the fact is noted that the device according to the invention, as has been already explained in detail, can be provided exactly simultaneously with the production process of the integrated circuit to be protected with standard processing phases and therefore requires no separate processing phases.

The invention thus conceived is susceptible of numerous modifications and variations, all of which are within the scope of the inventive concept. For example, the N⁻-type layer 15 may be fabricated by means of an ion implant and thermally grown simultaneously with layers 14 and 16.

Furthermore, all the details can be replaced by other technically equivalent ones.

We claim:

1. An electronic semiconductor device for protecting an integrated circuit against electrostatic discharges comprising two diodes connected back to back, said diodes comprising
   a substrate of a first conductivity type,
   an epitaxial layer of a second conductivity type extending between an outer face of the device and said substrate,
   a buried layer having a second conductivity type, substantially opposite to said first conductivity type, said buried layere extending between said substrate and said epitaxial layer,
   first and second simultaneously implanted regions of said first conductivity type substantially including said first conductivity type substrate, said first and second regions being highly-doped with respect to said substrate and extending in said substrate and in said epitaxial layer in contact with said buried layer on two opposite sides thereof, thereby forming with said buried layer two P-N junctions,
   and a connection zone of said first conductivity type, which is highly-doped with respect to said substrate, and substantially includes said first conductivity type substrate, said connection zone extending through said epitaxial layer, between said outer face of said device and said first region.

2. A device according to claim 1 comprising two back to back connected diodes, said diodes comprising said buried layer, and said first and second regions, said first and second regions thereby defining two P-N junctions with said buried layer, said first region being electrically connected to a voltage reference line, and said second region being connected to an input terminal of an integrated circuit to be protected.

3. A device according to claim 1, wherein said device is arranged below an input pad of said integrated circuit to be protected.

* * * * *